United States Patent
Yamazaki et al.

[11] Patent Number: 5,817,549
[45] Date of Patent: *Oct. 6, 1998

[54] METHOD FOR MANUFACTURING A SEMICONDUCTOR DEVICE

[75] Inventors: Shunpei Yamazaki, Tokyo; Yasuhiko Takemura, Kanagawa, both of Japan

[73] Assignee: Semiconductor Energy Laboratory Co., Ltd., Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 521,535

[22] Filed: Aug. 30, 1995

[30] Foreign Application Priority Data

Aug. 31, 1994 [JP] Japan ..................... 6-230648

[51] Int. Cl.$^6$ ............... H01L 21/00; H01L 21/31
[52] U.S. Cl. ............ 438/166; 438/789; 438/790; 438/793; 438/794
[58] Field of Search ............ 437/239, 40 GS, 437/41 GS, 21, 40 TFT, 41 TFT, 241, 242; 438/166, 789, 790, 793, 794

[56] References Cited

U.S. PATENT DOCUMENTS

| 5,147,826 | 9/1992 | Liu et al. | 437/233 |
| 5,275,851 | 1/1994 | Fonash et al. | 427/578 |
| 5,426,064 | 6/1995 | Zhang | 437/40 |
| 5,525,550 | 6/1996 | Kato | 437/238 |
| 5,591,681 | 1/1997 | Wristers | 437/240 |

FOREIGN PATENT DOCUMENTS 63-15468  1/1988  Japan .

OTHER PUBLICATIONS

S.Wolf, "Silicon Processing for the VLSI Era, vol. 3," Lattice Press, Sunset Beach California (1995) pp. 648–651.
A.T. Wu, et al., "Nitridation–induced surface donor layer in silicon," Appl. Phys. Lett. V. 55, No. 16 pp. 1665–1667, Oct. 1989.
J. Ahn, et al., "High quality thin gate oxide prepared by annealing low pressure chemical vapor deposited SiO2 in N2O," Appl. Phys. Lett. V. 59, No. 3, pp. 283–285, Jul. 1991.
S.C. Kim, et al. "Effect of N2 plasma treatment on SiO2 gate insulator in a–Si:H thin film transistor," Mat Res. Soc. Symp. Proc. vol. 336, 1994.
G. Liu et al., "Polycrystalline silicon thin film transistors on Corning 7059 glass substrates using short time, low–temperature processing," Appl. Phys. Lett. 62(20), May 17, 1993, pp. 2554–2556.
G. Liu et al., "Selective area crystallization of amorphous silicon films by low–temperature rapid thermal annealing," Appl. Phys. Lett. 55(7), Aug. 14, 1989, pp. 660–662.

Primary Examiner—John Niebling
Assistant Examiner—Michael S. Lebentritt
Attorney, Agent, or Firm—Sixbey, Friedman, Leedom & Ferguson, P.C.; Gerald J. Ferguson, Jr.; Eric J. Robinson

[57] ABSTRACT

A TFT having a crystalline semiconductor layer and a gate insulating film of silicon oxide is manufactured. The gate insulating film is formed by vapor phase deposition such as sputtering or CVD and the deposited silicon oxide is thermally annealed in a reactive nitrogen atmosphere. The silicon oxide film, especially, the boundary portion of the silicon oxide film close the active region is nitrided. Thus, dangling bonds included in the silicon oxide film can be neutralized.

56 Claims, 6 Drawing Sheets

METHOD FOR MANUFACTURING A SEMICONDUCTOR DEVICE

BACKGROUND OF THE INVENTION

1. Field of the Invention

This invention concerns semiconductor devices which have an insulated gate structure in which a silicon film which is formed on an insulating substrate, such as a glass for example, or on an insulating film which is formed on various types of substrates, is used, such as thin film transistors (TFT) and thin film diodes (TFD), or thin film integrated circuits in which these devices are used, and especially thin film integrated circuits for active type liquid crystal display (liquid crystal display) purposes, for example, and a method for manufacturing these devices, and, in particular, it concerns a method for the treatment of gate insulating films, and treatment apparatus for gate insulating films, for forming the above mentioned semiconductor devices by means of a low temperature process in which the highest process temperature is not more than 700° C.

2. Description of the Prior Art

Semiconductor devices which have TFT on an insulating substrate such as a glass, such as active liquid crystal display devices and image sensors in which TFTs are used to drive picture elements for example, have been developed in recent years. Glass substrates which have a strain point of not more than 750° C., and typically of 550–680° C., are generally used for these substrates in view of both mass productivity and cost. Hence, the highest process temperature when such glass substrates are used must be not more than 700° C., and preferably not more than 650° C.

Thin film-like silicon semiconductors have generally been used for the TFTs. The thin film silicon semiconductors can be broadly classified into two types, namely those consisting of an amorphous silicon semiconductor (a-Si) and those consisting of a silicon semiconductor which has crystallinity. The amorphous silicon semiconductors can be manufactured comparatively easily through a vapor phase method with a low production temperature, and they are suitable for mass production. Therefore, the amorphous semiconductors are used most generally, but their properties, such as their electric field effect mobility and electrical conductivity for example, are poor when compared with those of silicon semiconductors which have crystallinity. Therefore, there is a considerable demand for the establishment of a method for the manufacture of TFTs using silicon semiconductors which have crystallinity for attaining high speed characteristics.

The characteristics of the gate insulating film are not a serious problem in the case of a TFT where amorphous silicon which has a small mobility has been used. For example, a silicon nitride film which has poor electrical characteristics when compared with silicon oxide can be used for the gate insulating film of a TFT in which amorphous silicon has been used. However, with a TFT in which a crystalline silicon film which has a high mobility is used, the characteristics of gate insulating films are very important as well as the characteristics of silicon films.

The demand for good quality gate insulating films has become very great, especially in view of the improvement in the technology for obtaining crystalline silicon films. In this connection, with a TFT having a crystalline silicon film in which the channel forming region is comprised of essentially one single crystal or a plurality of crystals and the orientations of all of the crystals are the same (such crystalline forms are known as a mono-domain), the existence of the grain boundaries hardly affects the characteristics of the device, unlike with the usual TFT in which the polycrystalline silicon is used, and the electrical characteristics are determined almost entirely by the characteristics of the gate insulating film.

More specifically, the crystal orientations of two crystals which form a grain boundary are different from one another in the usual polycrystalline structure and, as a result, a high grain boundary barrier is produced. However, even though it is comprised of a plurality of crystals, in a mono-domain structure the crystal orientations of the two crystals which form a grain boundary corresponding to a grain boundary in the usual polycrystalline material are the same and so the barrier at such a boundary is very low, and it is no different from a single crystal. Consequently, in a mono-domain structure the contribution of the grain boundaries to the TFT characteristics is very small, and the characteristics are determined mostly by the gate insulating film.

Thermal oxide films are known as excellent gate insulating films which are ideal for such a purpose. For example, gate insulating films can be obtained using the thermal oxidation method provided that they are on a substrate such as a quartz substrate which can withstand high temperatures. (For example, JP-B-H3-71793) (The term "JP-B" as used herein signifies an examined Japanese patent publication).

However, a high temperature of at least 950° C. is required to obtain a silicon oxide film which can serve as a gate insulating film by means of the thermal oxidation method, and there is no other substrate material apart from quartz which can withstand such high temperatures. A maximum process temperature of not more than 700° C., and preferably of not more than 650° C., is required if glass substrates which have a low strain point, as described above, are to be used, and it is impossible to satisfy this requirement with the thermal oxidation method.

Gate insulating films must be produced using physical vapor phase growth (PVD) methods such as a sputtering method, or chemical vapor phase growth (CVD) methods such as a plasma CVD method and a thermal CVD method, because of the above mentioned problems. A highest process temperature of not more than 650° C. can be realized with these methods.

However, insulating films which have been produced using the PVD methods and CVD methods have high concentrations of dangling bonds or hydrogen, and the interface characteristics are not good. Consequently, charge trapping (recombination) centers are likely to be formed because of the presence of the dangling bonds and hydrogen, and they are weak in respect of the implantation of hot electrons, for example. Furthermore, the withstand voltage is also low. Many recombination centers are formed at the interface with a crystalline silicon film in particular. Consequently, when used as gate insulating films of TFTs there is a problem in that the electric field mobility and the sub-threshold characteristic value (S value) are not good, or there is a problem in that a leak current of the gate electrode is considerable and the fall in the ON current (deterioration, change with the passage of time) is considerable.

For example, in general, in those cases where a sputtering method which is a PVD method is used, a film which is a compound of only oxygen and silicon is formed in principle if a synthetic quartz target comprising silicon and oxygen of high purity is used for the target. However, it is very difficult to obtain a silicon oxide film in which the proportions of oxygen and silicon in the film obtained are close to the stoichiometric ratio and in which there are few dangling bonds. For example, it is possible to obtain a silicon oxide film which is close to the stoichiometric proportions if oxygen is used for the sputtering gas. However, oxygen has a low atomic weight and the sputtering rate (the deposition rate) is low, and it is inappropriate as a sputtering gas when mass production is considered.

Furthermore, although a satisfactory deposition rate can be obtained in an atmosphere of argon for example, the proportions of oxygen and silicon differ from the stoichiometric ratio and the material obtained is very inappropriate as a gate insulating film.

Moreover, it is difficult to reduce the number of dangling bonds of silicon whatever the sputtering atmosphere, and the dangling bonds of Si● or SiO●, must be stabilized as Si—H and Si—OH by carrying out a hydrogen anneal after a film formation. However, the Si—H and Si—OH bonds are unstable and they are easily broken by accelerated electrons such as hot electrons, and they are inevitably changed back into silicon dangling bonds. The presence of the such weak Si—H and Si—OH bonds is the cause of the deterioration due to hot carrier implantation as mentioned above.

Similarly, a large amount of hydrogen in the form of Si—H and Si—OH is included in a silicon oxide film which has been manufactured using the plasma CVD method and this gives rise to the above mentioned problems. In addition, in those cases where tetraethoxysilane (TEOS) is used as a source of silicon which can be handled comparatively easily, there is a problem in that carbon is included in the silicon oxide film.

SUMMARY OF THE INVENTION

The present invention provides a means of improving the characteristics of such silicon oxide films which are deposited by PVD methods and CVD methods.

In the present invention, a silicon oxide film is improved by subjecting gate insulating films of which the main component is silicon oxide which are deposited by a PVD method or a CVD method, covering island-like crystalline silicon, to a thermal annealing at 400–700° C. in a highly reactive gaseous nitrogen-containing atmosphere which has been excited thermally or which has been thermally decomposed. The gas used in this invention is preferably an nitrogen oxide, such as dinitrogen monoxide ($N_2O$), nitrogen monoxide (NO) or nitrogen dioxide ($NO_2$) (generally represented by $NO_x$, where $0.5 \leq x \leq 2.5$) or a hydrogen nitride such as ammonia ($NH_3$) or hydrazine ($N_2H_4$) (generally represented by $NH_x$, where $1.5 \leq x \leq 3$).

The gas obtained by thermally exciting or decomposing an nitrogen oxide (or hydrogen nitride) is referred to hereinafter as a reactive nitrogen oxide (or reactive hydrogen nitride). In the present invention, the reactive nitrogen oxide (or reactive hydrogen nitride) may be comprised of just the nitrogen oxide (hydrogen nitride) alone, or it may be mixed with argon or some other inactive gas. The characteristics of the silicon oxide film, and especially the interfacial characteristics with a silicon film, are improved by means of the thermal annealing using these reactive gases.

A thermal anneal in a normal atmosphere of hydrogen nitride or nitrogen oxide (which has a low concentration of molecules in an excited state and active species) or in an atmosphere of hydrogen, oxygen or ozone, for example, may be carried out before or after the thermal annealing process in which the reactive nitrogen oxide or hydrogen nitride, as described above, is used. Furthermore, a thermal annealing treatment with a reactive hydrogen nitride may be carried out after a thermal annealing with a reactive nitrogen oxide for example, or, conversely, a thermal annealing treatment with a reactive nitrogen oxide may be carried out after a thermal annealing treatment with a reactive hydrogen nitride. Of course, a thermal annealing with only one of these reactive gases is effective. The admixture of water ($H_2O$) or carbonic acid gases (CO, $CO_2$ etc.) in the atmosphere is undesirable. Water or carbon dioxide gas concentrations should be not more than 1 ppm, and preferably not more than 10 ppb.

An example of the apparatus for the execution of the thermal annealing in accordance with the present invention is shown in FIG. 1. A first reaction chamber 1 for thermally exciting the hydrogen nitride or nitrogen oxide initially, and the reactive nitrogen oxide or hydrogen nitride obtained in the first reaction chamber is introduced into a second reaction chamber 5 for carrying out the thermal annealing of the gate insulating film at a temperature of 400°–700° C. These reaction chambers and the connecting passageway 4 between them should be maintained at appropriate temperatures. The heaters 2, 3 and 6 are provided for this purpose.

It is necessary to raise the temperature inside the first reaction chamber 1 sufficiently high to excite the treatment gas highly reactive, namely, to a decomposition temperature of the gas or higher. The optimum temperature depends on the type of gas, and with dinitrogen monoxide a temperature of 750°–950° C. is preferred, and with ammonia a temperature of 750°–1000° C. is preferred.

The lower limit for the temperature in the second reaction chamber is determined by the reaction rate, and the upper limit is determined by the material, such as the substrate, which is being treated in this invention. In view of this, a temperature of 400°–700° C., and preferably of 450°–650° C., is appropriate in the second reaction chamber. Reaction proceeds more readily as the temperature in the second reaction chamber becomes higher, but in cases where glass substrates are used, for example, this would result in thermal shrinkage. At 650°–700° C. in particular, many glass substrates undergo thermal shrinkage, and this is a problem from the viewpoint of a fine pattern formation. A temperature below this strain point is preferred when glass substrates are used.

The gas molecules which have been excited in the first reaction chamber revert to the ground state in cases where the temperature in the connecting passageway 4 between the first and second reaction chambers is very low, and the reactivity is reduced. Hence, an appropriate temperature must also be maintained in the connecting passageway 4 in order to maintain the reactivity. The temperature in the connecting passageway 4 is preferably intermediate between those in the first and second reaction chambers. That is to say, if the temperature in the first reaction chamber 1 is $T_A$, the temperature in the connecting passageway 4 is $T_B$ and the temperature in the second reaction chamber 5 is $T_C$, then $T_A \leq T_B \leq T_C$. Furthermore, it is desirable the inner walls of the connecting passageway 4 should be made with a material of which the main component is quartz so that it does not react with the reactive gas molecules. The use of quartz of a high purity, comprising at least 90 mol. % silicon oxide, is preferred.

If the inner wall is comprised of a metallic material, the atoms or excited molecules may revert to the ground state or be stabilized by recombining, and the reactivity is lost. However, in those cases where the inner walls are made of quartz this effect is slight and, for example, most of the atoms and molecules are still in an active state even at a distance of 50–100 cm from the first reaction chamber.

A plurality of substrates 8 are mounted on the susceptor 7 in the second reaction chamber 5 and a plurality of substrates can be treated at once. Since a high temperature gas flows from the first chamber into the second reaction chamber, it is necessary to increase the uniformity of the temperature distribution in the second reaction chamber 5 by optimizing the temperature and length of the connecting passageway 4. If there is a temperature distribution within the second reaction chamber it is difficult to treat a plurality of substrates at the same time in a uniform manner. Furthermore, reducing the pressure of the gaseous atmosphere below atmospheric pressure is also effective.

It is difficult to render most of the gas molecules in the first reaction chamber reactive in the example shown in FIG. 1A. This is because thermal energy required to excite or decompose the gas must be obtained from the walls of the reaction chamber, and only a part of the total number of gas molecules can contact with the wall in the first reaction chamber. More precisely, reactivity is achieved by means of the kinetic energy of other gas molecules, but the energy imparted is obtained directly from other gas molecules or indirectly from the walls of the reaction chamber. Of course, the invention can be carried out if just a few reactive molecules are present. Needless to say, however, the effect of the invention increases as the number of reactive molecules is increased.

A material 9 which conducts heat comparatively easily or which absorbs infrared radiation easily, such as a metal, can be placed within the first reaction chamber, as shown in FIG. 1B, in order to render more gas molecules reactive. Preferably, this material should be in a form such as a mesh which has a large surface area, which does not impede the flow of gas and which makes contact with a large amount of gas. Most desirably, the material 9 has a catalytic action. Examples of such materials include platinum, palladium, (reduced) nickel, titanium, vanadium and cobalt. The catalyst may have a powder-like form or a granular form instead of being in the form of a mesh.

When in contact with such a material, the gas molecules become reactive in the same way as when making contact with the walls of the reaction chamber, and more gas molecules become reactive as the surface area becomes greater. Moreover, it is possible to obtain even more reactive gas if such materials have a catalytic action. Furthermore, the provision of a temperature which is higher than that in the first reaction chamber by passing an electric current through the mesh-like metal 9 is also effective.

If a means such as those indicated above is adopted then it is possible to lower the temperature in the first reaction chamber as compared with the case shown in FIG. 1A.

A sputtering method can be used as a PVD method, and a plasma CVD, a reduced pressure CVD, and an atmospheric CVD method can be used as a CVD method, for example, for forming the gate insulating film in the present invention. Other methods of film formation can also be used. The plasma CVD methods and reduced pressure CVD method using TEOS as a raw material may be used. A substrate temperature of 200°–500° C. is preferred for depositing a silicon oxide film using TEOS and oxygen as raw materials in the plasma CVD method. Furthermore, the reaction in which TEOS and ozone are used in a reduced pressure CVD method proceeds at a comparatively low temperature (for example, at 375°° C.±20° C.), and silicon oxide films which are undamaged by the plasma can be obtained.

Similarly, silicon oxide films which are undamaged by a plasma can also be obtained with a reduced pressure CVD method using monosilane ($SiH_4$) and oxygen ($O_2$), or monosilane and dinitrogen monoxide, as raw materials.

The combination of monosilane and dinitrogen monoxide may be used in the plasma CVD method. Furthermore, in plasma CVD methods, the ECR-CVD method in which a discharge using an ECR (electron cyclotron resonance) condition is used causes little damage due to plasma and so it is possible to form even better gate insulating films with this method.

It was found by the inventors that insulating films which had silicon oxide which had been fortified to a certain extent was suitable for the gate insulating films of TFTs. Specifically, silicon oxide films of which the etching rate with a buffered hydrofluoric acid at 23° C., containing hydrogen fluoride, ammonium fluoride and acetic acid at proportion of 1:50:50, was not more than 1000 Å/minute, and typically 300–800 Å/minute, were preferred. Silicon oxide films which contain, on average, $1\times10^{17}$–$1\times10^{21}$ atoms/cm$^3$ of nitrogen mostly satisfy such an etching rate condition.

Amorphous silicon films obtained by means of a CVD method such as a plasma CVD method or a reduced pressure CVD method are to be used as a starting material for forming a crystalline silicon film as an active layer in the present invention, and the methods of crystallization can be divided broadly into two types. The first method is that in which an amorphous silicon film is formed and then this is crystallized by thermal annealing at a temperature of 500°–650° C. for an appropriate period of time. Elements which promote the crystallization of amorphous silicon, such as nickel, iron, platinum, palladium and cobalt, may be added at the time of this crystallization. The crystallization temperature can be lowered and the crystallization time can be shortened if these elements are added.

The semiconductor characteristics of silicon are lost if these elements are included at high concentrations and so a low concentration which is enough for crystallization but which has virtually no effect on the semiconductor characteristics is preferred. That is to say, the minimum concentration in the silicon film as measured using secondary ion mass spectrometry (SIMS) is preferably $1\times10^{15}$–$3\times10^{19}$ atoms/cm$^3$. The concentration distribution of such elements which promote crystallization varies according to the method of treating the silicon film and so there are cases where the minimum value is obtained at a boundary and cases where the minimum value is obtained in the middle of the film.

The second method is a laser annealing method in which amorphous silicon films are crystallized by being irradiated with strong light from a laser for example. Which of the two methods indicated above is chosen should be determined on the basis of the characteristics of the TFT for which the execution of the invention is required, the apparatus which can be used and the plant costs, for example.

Furthermore, the first and second methods may be combined with each other. For example, the crystallinity may be further increased by a laser anneal after the crystallization by the thermal annealing. In those cases where a crystallization promoting element such as nickel is added and thermal annealing is carried out in particular, amorphous parts have been observed to remain at the crystal grain boundaries, and the laser annealing method is effective for crystallizing such amorphous parts.

Conversely, the stress and strain in the film produced by laser annealing can be alleviated by thermally annealing the silicon film which has been crystallized by means of a laser anneal.

Silicon oxide films which are formed by means of a CVD method or a PVD method contain many unpaired silicon bonds or Si—H bonds and Si—OH bonds. When such a silicon oxide film is treated at a high temperature of at least 800° C. in a dinitrogen monoxide atmosphere, the Si—H bonds in the silicon oxide film are nitrided or oxidized and converted to Si≡N, $Si_2$=N—O bonds or Si—N=O bonds for example. The Si—OH bonds are also converted in the same way. This reaction proceeds readily at the boundary between the silicon oxide film and the silicon film in particular and, as a result, the nitrogen is concentrated at this boundary. The amount of nitrogen added and concentrated near the boundary with such a means is at least ten times the average concentration in the silicon oxide film. Furthermore, the material is preferred as a gate insulating film when 0.1–10 atom. %, and typically 1–5 atom. %, of nitrogen is included in the silicon oxide.

However, such reactions do not proceed at low temperatures of 750° C. and below. This is because the dinitrogen monoxide is not decomposed at such low temperatures so that no active atoms ormolecules which can be introduced into the interior of the silicon oxide film are obtained. That is to say, the degradation reaction of the dinitrogen monoxide is rate determining in the reaction described above. The same is true with other oxides of nitrogen such as nitrogen monoxide and nitrogen dioxide, even though the optimum temperature is different, and improvements of silicon oxide films and of the boundary between a silicon oxide film and an active layer is impossible at temperatures of 400°–700° C., and preferably of 450°–650° C., such as those which are the aim of the present invention.

However, if such an nitrogen oxide is converted to a reactive form, as in the present invention, active atoms or molecules are included in the gas and so it penetrates into the interior of the silicon oxide film even at temperatures of 700° C. and below, and the above mentioned reactions occur. The present invention is intended to enable the reactivity to be maintained for a long time and be spatially mobile on the basis of appropriate conditions for the nitrogen oxide which is rendered reactive. That is to say, the nitrogen oxide which is made reactive by being heated to a high temperature is introduced into a reaction chamber at a lower temperature and can react with a gate insulating film. A temperature of 400°–700° C. is also required for the thermal anneal in the present invention, but this temperature is not the temperature required to decompose the nitrogen oxide but the temperature which is required to introduce the active atoms or molecules into the interior of the silicon oxide film.

The same phenomenon cannot be expected in a silicon oxide film which is obtained by thermal oxidation. This is because a thermal oxide film is very dense and so a high temperature of at least 950° C. is required to introduce even active gas molecules into the inner portions of the film. Silicon oxide films which are formed by a CVD method or a PVD method are imperfect when compared with a thermal oxide film and so the reaction proceeds at temperatures of 650° C. and below, as described above. Thus, the result of the invention is that even silicon oxide films which have been formed by means of a CVD method or a PVD method are formed into dense silicon oxide films which do not deteriorate, like thermal oxide films, and the boundary levels (originating mainly from unpaired bonds and Si—H bonds) which are produced in quantity at the boundary between the silicon oxide and silicon can be reduced.

The same phenomena occur in atmospheres of hydrogen nitrides such as ammonia and hydrazine. For example, when a silicon oxide film which has been accumulated by means of a CVD method or a PVD method is annealed at a high temperature of at least 850° C. in an ammonia atmosphere, the unpaired silicon bonds and the Si—H bonds and Si—OH bonds are converted to nitrides, such as Si≡N for example. As before, this reaction does not proceed at 650° C. because a high temperature of at least 850° C. is required to decompose the ammonia and provide active nitrogen atoms.

Hence, if the ammonia is first rendered reactive, the nitriding reaction proceeds even at low temperatures of 400°–700° C.

Moreover, on treatment with a hydrogen nitride, the Si—H bonds and Si=O bonds are nitrided and form Si—N=$H_2$ bonds. This occurs even when there is no reactivity. Such bonds can be converted to very stable Si≡N bonds and Si—N=O bonds by annealing subsequently in a dinitrogen monoxide atmosphere.

Moreover, the effect on a gate insulating film differs from each other between the case of using a hydrogen nitride and the case of using nitrogen oxide. This is explained below with reference to FIG. 7. In FIG. 7, "a" shows the concentration of nitrogen in a silicon oxide film deposited using a sputtering method on a crystalline silicon active layer, analyzed using secondary ion mass spectrometry (SIMS). The determined values are effective only in the silicon oxide part (the gate insulating film) and it is shown that the concentration of nitrogen is $1\times10^{18}$ atoms/cm$^3$. A peak can be seen near the bounda active layer and the gate insulating film, but this is due to the effect of the discontinuity of the material (a matrix effect) and, in fact, there is no increase in the nitrogen concentration at the boundary.

This material was annealed for 1 hour respectively in dinitrogen monoxide and ammonia atmospheres, using the apparatus shown in FIG. 1. At this time the temperatures were set so that $T_A$=850° C., $T_B$=750° C. and $T_C$=600° C. On analyzing the silicon oxide films which had been treated in this way using SIMS in the same way as before, the results were as shown by "b" and "c" in FIG. 7. With "b" which was treated with dinitrogen monoxide, a peak in the nitrogen concentration can be seen at the boundary as with "a", but the maximum value is two orders of magnitude greater than that for "a". This signifies that although there is a contribution from the matrix effect, nitrogen has in fact concentrated close to the boundary.

On the other hand, with "c" which had been treated in ammonia, the nitrogen concentration was increased generally in the gate insulating film and no particular concentration was observed at the boundary. Thus, the silicon oxide is converted to a silicon oxinitride by the ammonia treatment.

The present invention is especially advantageous when applied to silicon oxide films which are formed by sputtering (and especially those silicon oxide films in which the oxygen concentration within the film is below the stoichiometric ratio). This is because if such a film is annealed in a reactive nitrogen oxide atmosphere it is possible to supplement the deficient oxygen and to provide a silicon oxide film composition approaching the stoichiometric ratio. Similarly, electrically stable silicon oxinitride films can be obtained by introducing nitrogen into the sites which should be occupied by oxygen by annealing in a reactive hydrogen nitride atmosphere.

The facts outlined above show that the formation of a silicon oxide film by means of the sputtering method is of use. That is to say, in the past, only limited atmospheric conditions could be used to form silicon oxide films using the sputtering method to ensure that the composition approached the stoichiometric ratio. For example, if a mixed atmosphere of oxygen and argon was considered, conditions such that the ratio oxygen/argon was greater than 1 had to be satisfied, and sputtering in a pure oxygen atmosphere was desirable. Consequently, the rate of film formation was slow and it was not suitable for mass production. Furthermore, oxygen is a reactive gas and there were also problems with oxidation of the vacuum apparatus and the chamber for example.

However, by means of the present invention, even silicon oxide films which have a composition far deviated from the stoichiometric ratio can be converted to silicon oxide films which are suitable for use as gate insulating films, and so sputtering can be carried out under more useful conditions in terms of the film formation rate in an oxygen/argon mixed atmosphere in which the ratio oxygen/argon is less than or equal to 1. For example, the film formation rate is very high in a pure argon atmosphere, and the film formation under stable conditions is also possible.

The present invention is also effective when applied to silicon oxide films which are formed by a CVD method such as a plasma CVD method or a reduced pressure CVD method using a silicon source which contains carbon, such as TEOS for example. These silicon oxide films contain large amounts of carbon and the carbon which is present close to the boundary with the silicon film in particular deteriorates the characteristics of a TFT. In the present invention, oxidation proceeds on annealing in a reactive nitrogen oxide atmosphere in particular and, at this time, the carbon is oxidized as well and released to the outside as carbon dioxide gas, and the carbon concentration in the film can be reduced.

This process is described below with reference to FIG. 5. Atomic nitrogen and oxygen are included in large amounts in reactive dinitrogen monoxide. These species can easily enter into the interior of the silicon oxide film. Then, the atomic oxygen unites chemically with the carbon (much of which is present in the form of Si—C bonds) which is present within the silicon oxide to form the chemically very stable carbon dioxide gas, and this is discharged to the outside. On the other hand, the silicon which was bonded to the carbon is left as an unpaired bond, but this is nitrided and converted to an Si—N bond for example.

The invention has a special effect when applied to active layers comprising crystalline silicon films which are crystallized with the addition of elements which promote the crystallization of amorphous silicon films, such as nickel, cobalt, iron, platinum and palladium for example. The crystallinity of a silicon film which is crystallized with the addition of such crystallization promoting elements is good, and films in which the electric field effect mobility is also very high can be obtained, but films which have good characteristics as gate insulating films are desirable as well. The gate insulating films obtained with the present invention are suitable for this purpose. Furthermore, the non-crystalline regions which remain at the crystal grain boundaries, for example, can also be crystallized by means of an annealing process of the present invention, and the crystallinity can be improved even further.

When the present invention is applied to an active layer in which a silicon film which is laser annealed is used, in addition to the effect of improving the characteristics of the gate insulating film, the annealing process of the present invention also has the effect of alleviating the strain in the silicon film caused by the laser annealing.

Furthermore, in those cases where a silicon film which has very good crystallinity, such as a mono-domain structure, has been used, characteristics similar to those of a thermal oxide film are required for the gate insulating film, and the CVD oxide films and PVD oxide films in accordance with the present invention are suitable for this purpose.

DETAILED DESCRIPTION OF THE EXAMPLES

EXAMPLE 1

This example is directed to the formation of an N-channel type TFT using a silicon oxide film as a gate insulating film formed by a sputtering method and subjected to a thermal treatment in accordance with the present invention.

First, a silicon oxide film was formed to a thickness of 1000–3000 Å, for example to a thickness of 2000 Å, as a blocking film 12 on a substrate 11 (Corning 7059, 100 mm×100 mm). The blocking film 12 prevents the contamination from the substrate. The silicon oxide film was subjected to a 4 hour thermal annealing at 640° C. in an oxygen atmosphere or a dinitrogen monoxide atmosphere and the state of its surface was stabilized.

Figure 2A:
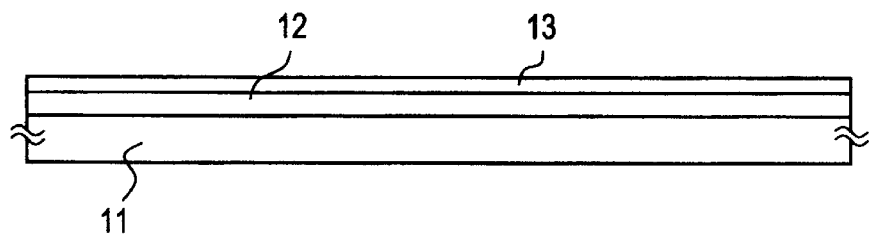
FIGS. 2A–2E are cross sectional views showing the manufacturing process in accordance with Example 1 of the present invention.

Next, an amorphous silicon film having a thickness of 100–1500 Å, for example 500 Å, was formed using a plasma CVD method. Subsequently, a trace amount of an element which promoted crystallization, such as nickel, iron, platinum, palladium or cobalt for example, was added and the film was annealed, so that the crystalline silicon film 13 was obtained. In this example a solution of nickel acetate was dropped onto the amorphous silicon film and spun dry and a very thin film of nickel acetate was formed on the amorphous silicon film. Subsequently, the nickel was introduced into the amorphous silicon film by carrying out a 4 hour thermal anneal at 550° C. in a nitrogen atmosphere and the film was crystallized. After this process the film may be subjected to a laser anneal in order to improve further the crystallinity of the crystalline silicon film. (FIG. 2A)

Next, the crystalline silicon film 13 was etched and the island-like silicon film 14 was formed. This island-like film 14 is the active layer of the TFT. Then, a silicon oxide film having a thickness of 200–1500 Å, for example 1000 Å, was formed by a sputtering method as a gate insulating film 15, covering this island-like silicon film 14. In this example, the silicon oxide film was formed by sputtering in an oxygen atmosphere using a synthetic quartz target. Argon can be used for the sputter gas. Moreover, in this example, the sputter gas pressure was 1 Pa, the power input was 350 W and the substrate temperature was 200° C.

Figure 1A:
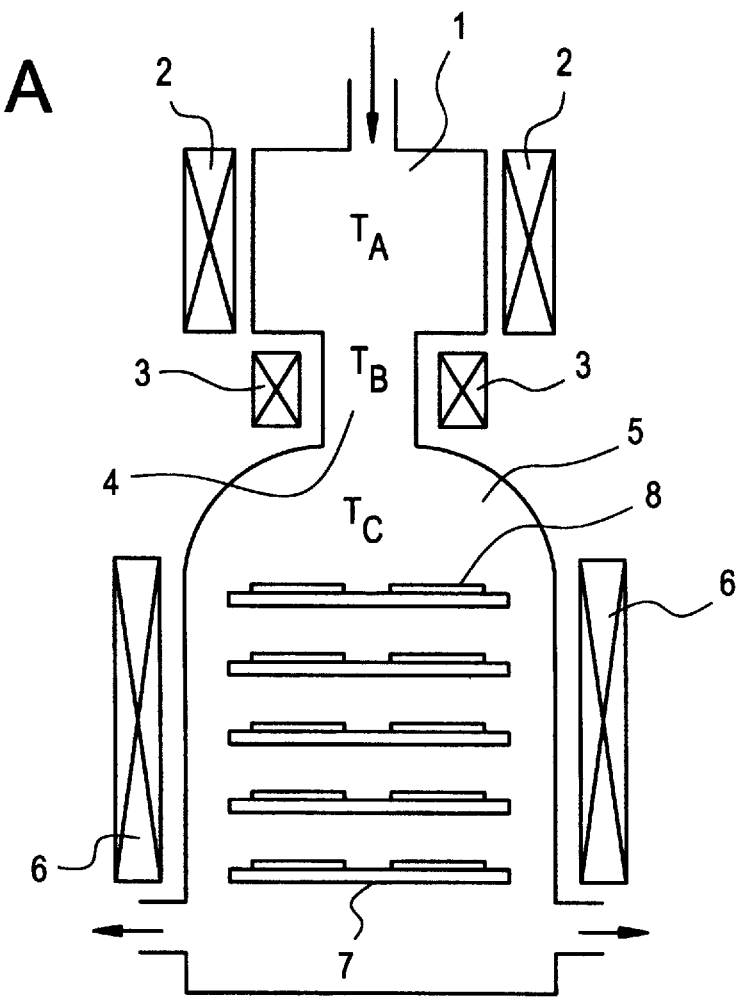
FIGS. 1A and 1B show apparatuses in accordance with the present invention.
Figure 1B:
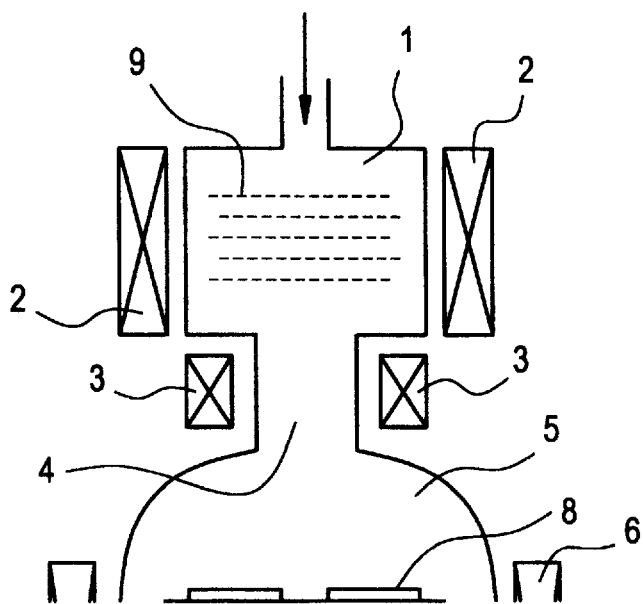
Figure 2B:
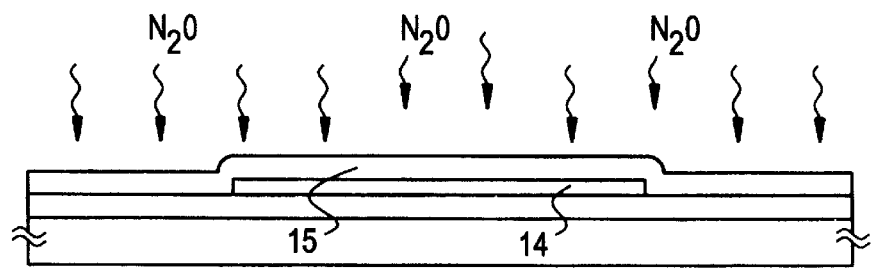

After the gate insulating film 15 had been formed it was subjected to a heat treatment of the present invention and the characteristics of a gate insulating film, and especially the interface characteristics between the gate insulating film and the active layer, were improved. The apparatus shown in FIG. 1 was used in this example. Furthermore, dinitrogen monoxide was used as the gas for the annealing treatment. The temperature $T_A$ of the first reaction chamber 1 is preferably set to 750°–950° C. and the temperature $T_C$ in the second reaction chamber 5 is preferably set to 500°–650° C. In this example, $T_A$ was set to 850° C. and $T_C$ was set to 550° C. Further, the temperature $T_B$ of the connecting passageway 4 was set between these, to 750° C. The pressure in each reaction chamber was preferably 0.5–1.1 atmospheres, but it may have been set to a more reduced pressure atmosphere. In this example it was set to 1 atmosphere. Furthermore, the dinitrogen monoxide flow rate in this example was 5 liters/minute. Moreover, the thermal annealing time is 0.5–6 hours, and it was set, for example, to 1 hour, in this example. As a result, the hydrogen in the silicon oxide film and at the boundary with the silicon film was nitrided or oxidized and reduced in quantity and, conversely, the nitrogen concentration at the boundary was increased. (FIG. 2B)

Figure 2C:
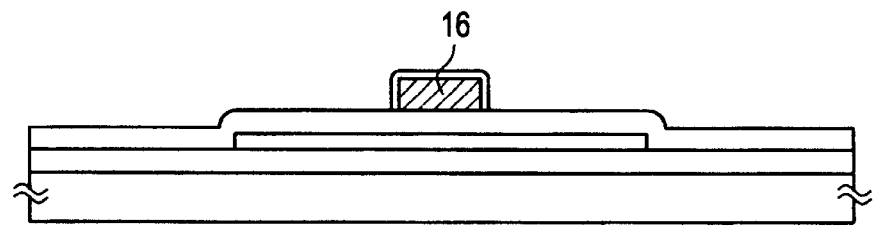

Subsequently, an aluminum film (containing 1 wt. % Si or 0.1–0.3 wt. % Sc) having a thickness of 3000 Å–2 μm, for example 5000 Å, was formed by the sputter method and this was then patterned and the gate electrode 16 was formed. Then, the substrate was immersed in a 1–3% tartaric acid containing ethylene glycol solution which was adjusted to about pH 7 with ammonia, and anodic oxidation was carried out using a platinum cathode and the aluminum gate electrode 16 as the anode. The anodic oxidation was completed by raising the voltage to 140 V at the initial fixed current and maintaining this state for 1 hour. An anodic oxide film having a thickness of about 2000 Å was formed in this way. (FIG. 2C).

Figure 2D:
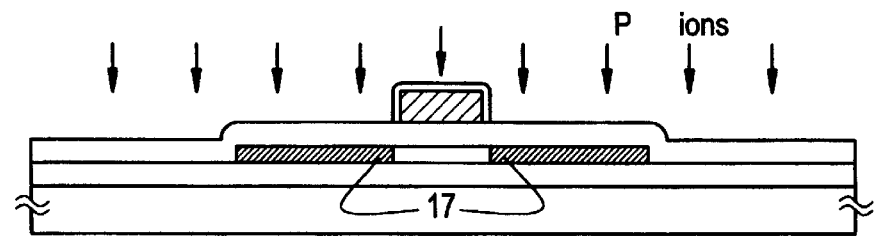

Subsequently, phosphorus was implanted as an impurity in the island-like silicon film 14 by means of the ion doping method in a self-alignment manner using the gate electrode 16 as a mask. The preferred dose rate at this time is $1 \times 10^{14} - 8 \times 10^{15}$ atoms/cm$^2$, and the preferred accelerating voltage is 50 –90 kV. The dose rate in this example was $1 \times 10^{15}$ atoms/cm$^2$, and the accelerating voltage was 80 kV. The N-type impurity regions (source and drain regions) 17 were formed as a result. (FIG. 2D)

Moreover, activation of the doped impurity regions was carried out by irradiation with laser light. A KrF excimer laser (wavelength 248 nm, pulse width 20 nsec) was used for the laser light, and the energy density was 200–400 mJ/cm$^2$, being set, for example, to 250 mJ/cm$^2$.

Figure 2E:
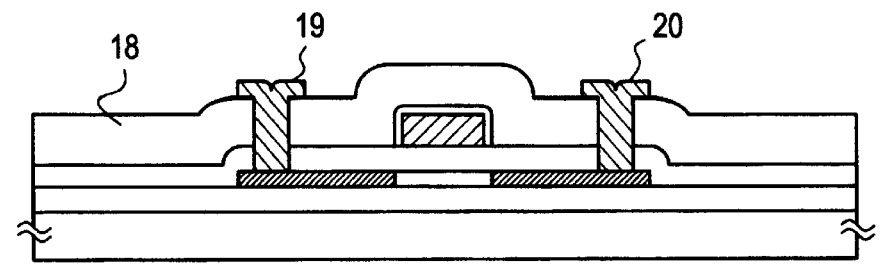

Subsequently, a silicon oxide film having a thickness of 3000 Å was formed over the whole surface, using a plasma CVD method, as an inter-layer insulating film 18, and contact holes were formed in the source/drain regions by etching this inter-layer insulating film 18 and the gate insulating film 15. Moreover, an aluminum film having a thickness of 5000 Å was formed using a sputtering method and this was etched to form the source/drain electrodes 19 and 20. An N-channel type TFT was formed by the processes outlined above. (FIG. 2E)

The TFT which was formed in this way showed little deterioration because the durability of the gate insulating film was excellent, and a TFT which had excellent characteristics was obtained. For example, the deterioration of the TFT characteristics was evaluated by fixing the drain voltage at +14 V and varying the gate voltage from −17–+17 V.

If the deterioration factor is defined as $1-(\mu_{1O}/\mu_O)$ with the electric field effect mobility $\mu_O$ obtained on the first measurement and the electric field effect mobility $\mu_{1O}$ obtained after applying the above mentioned voltage, the deterioration of the TFT obtained in this example was 0.8%.

For comparison, the deterioration factor for a TFT which had been made with the thermal annealing process of the gate insulating film of this invention being carried out as a thermal annealing treatment for 3 hours at 550° C. in a nitrogen atmosphere and not a dinitrogen monoxide atmosphere, but with the other manufacturing conditions being the same as before, was 52.3%.

EXAMPLE 2

This example shown with reference to FIGS. 3A–3E is directed to a formation of CMOS type TFTs using a silicon oxide film as a gate insulating film deposited by a plasma CVD with TEOS and oxygen as raw materials and subjected to a thermal annealing treatment in accordance with the present invention.

First, a silicon oxide film having a thickness of 2000 Å was formed as a blocking film 22 on a substrate 21 (NH Technoglass, NA35, 100 mm ×100 mm).

Figure 3A:
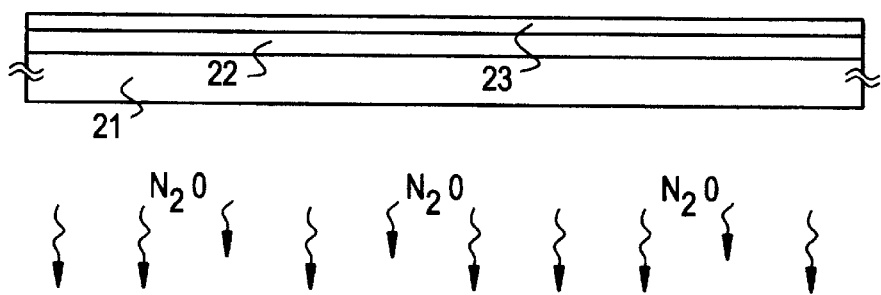
FIGS. 3A–3F are cross sectional views showing the manufacturing process in accordance with Example 2 of the present invention.

Next, an amorphous silicon film having a thickness of 500 Å, was formed using the plasma CVD method. Subsequently, in the same way as in Example 1, a solution of nickel acetate was spun dry and a very thin film of nickel acetate was formed on the amorphous silicon film. The nickel was then introduced into the amorphous silicon film by carrying out a 4 hour thermal anneal at 550° C. in a nitrogen atmosphere, and the film was crystallized. Subsequently, the film was subjected to a laser anneal using a KrF excimer laser (wavelength 248 nm) in order to improve further the crystallinity. A laser energy density of 250–350 mJ/cm$^2$ is appropriate. It was set to 300 mJ/cm$^2$ in this example. The crystalline silicon film 23 was obtained in the way described above. The crystalline silicon film obtained in this way had comparatively large crystal grains (some 10 μm square), and it had a mono-domain structure, exhibiting the same crystal orientation over a range from a few times to a few tens of times. (FIG. 3A)

Next, the crystalline silicon film 23 was etched and the island-like silicon films 24 and 25 were formed. These island-like films 24 and 25 are the active layers of TFTs. Although the active layers were formed randomly in this example, many of them were observed with TFT channel forming regions which had a mono-domain structure.

Subsequently, a silicon oxide film having a thickness of 200–1500 Å, for example 1000 Å, was formed as the gate insulating film 26, covering the island-like silicon films 24 and 25. In this example the silicon oxide film was formed by means of the plasma CVD method with TEOS and oxygen for the raw material gas. The film forming conditions at this time were gas pressure 4 Pa, input voltage 150 W and substrate temperature 350° C.

After the gate insulating film had been formed it was subjected to an annealing treatment of the present invention and the characteristics of a gate insulating film, and especially the characteristics of the boundary between the gate insulating film and the active layers, were improved. In this example the substrate was first located in the thermal annealing apparatus shown in FIG. 1 and hydrogen was passed into the reaction chamber 5 initially and a thermal annealing treatment was carried out for 2 hours at 350° C. As a result, the unpaired bonds in the silicon oxide film were taken up with hydrogen.

Next, a gaseous mixture of dinitrogen monoxide and argon (dinitrogen monoxide : argon =1:1) was introduced, and the temperature $T_A$ of the first reaction chamber 1 was set to 700° C., the temperature in the connecting passageway 4 was set to 650° C. and the temperature $T_C$ in the second reaction chamber was set to 600° C. The pressure in the reaction chambers was set to 1 atmosphere and the reaction gas flow rate was set to 3 liters/minute, and the duration of the thermal anneal was set to 1 hour. Moreover, mesh-like platinum was established as a catalyst in the first reaction chamber 1 in this example. Consequently, it was possible to reduce the temperature in the first reaction chamber when compared with that in Example 1 and promote the decomposition of the dinitrogen monoxide, and a similar effect to that in Example 1 was obtained using a smaller quantity of dinitrogen monoxide.

Figure 3B:
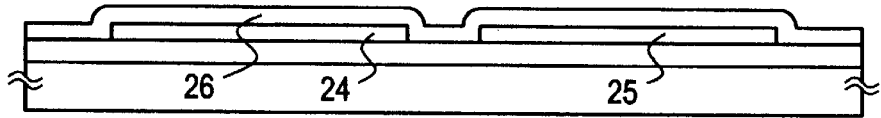

As a result of this process, the hydrogen in the silicon oxide film and at the boundary with the silicon film was nitrided or oxidized and reduced in quantity. Carbon was present in the silicon oxide film before the thermal anneal since TEOS was used as a raw material gas, but this carbon was also oxidized at this time and released as carbon dioxide gas, and the amount of carbon included was reduced. It was possible to form a silicon oxide film which was desirable as a gate insulating film in this way. (FIG. 3B)

Figure 3C:
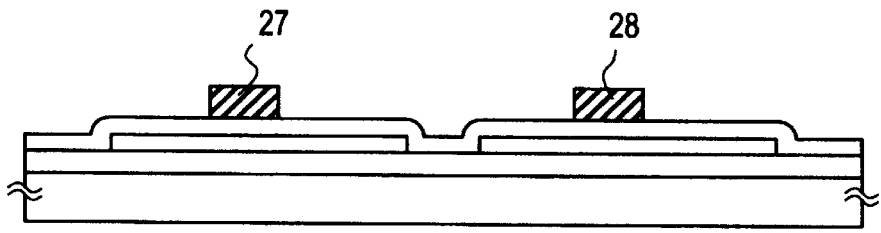

Subsequently, a polycrystalline silicon film having a thickness of 6000 Å was formed by means of the reduced pressure CVD method and this was patterned to form the gate electrodes 27 and 28. A trace amount of phosphorus was added to the polycrystalline silicon film in order to increase its electrical conductivity. (FIG. 3C)

Figure 3D:
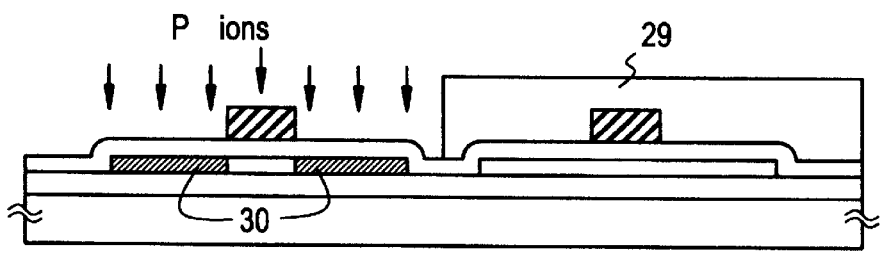

Subsequently, an impurity was implanted into the island-like silicon films 24 and 25, by means of the ion doping method in a self-alignment manner using the gate electrode 27 and 28 as a mask. First of all, phosphorus was implanted while covering the region which was to form the P-type channel TFT with the photoresist mask 29, and the N-type impurity regions 30 (source/drain regions) were formed. The preferred dose rate at this time is $1\times10^{14}$–$8\times10^{15}$ atoms/cm$^2$, and the preferred accelerating voltage is 50–90 kV. The dose rate in this example was $5\times10^{14}$ atoms/cm$^2$, and the accelerating voltage was 80 kV. (FIG. 3D).

Figure 3E:
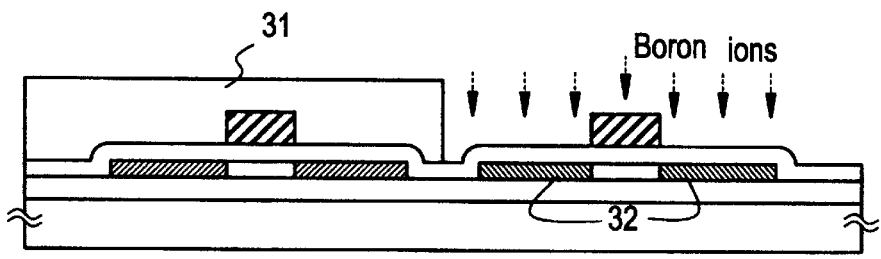

Subsequently, arsenic was implanted while covering the region which formed the N-type channel TFT with the photoresist mask 31 and the P-type impurity regions 32 (source/drain regions) were formed. The preferred dose rate at this time is $1\times10^{14}$–$8\times10^{15}$ atoms/cm$^2$, and the preferred accelerating voltage is 40–80 kV. The dose rate in this example was $1\times10^{15}$ atoms/cm$^2$ and the accelerating voltage was 65 kV. (FIG. 3E).

Moreover, activation of the doped impurity regions 30 and 32 was carried out by irradiation with laser light. A KrF excimer laser (wavelength 248 nm, pulse width 20 nsec) was used for the laser light, and the energy density was 200–400 mJ/cm$^2$, being set, for example, to 250 mJ/cm$^2$.

Figure 3F:
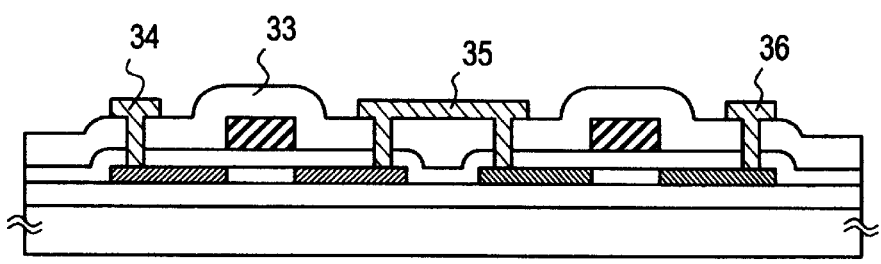

Subsequently, a silicon oxide film having a thickness of 5000 Å was formed over the whole surface, using the plasma CVD method, as the inter-layer insulating film 33, and contact holes were formed in the source/drain regions 30 and 32 by etching this inter-layer insulating film 33 and the gate insulating film 26. Moreover, an aluminum film having a thickness of 5000 Å was formed using the sputter method and this was etched to form the source/drain electrodes 34, 35 and 36, and the CMOS type TFT was obtained. (FIG. 3F)

EXAMPLE 3

This example shown in FIGS. 4A–4F is directed to the manufacture of a P-type TFT for an active matrix device (as a pixel TFT), using a silicon oxide film formed by an ECR-CVD method and subjected to a thermal annealing treatment in accordance with the present invention.

Initially, a silicon oxide film having a thickness of 3000 Å was formed as a blocking film 42 on a substrate 41 (100 mm ×100 mm).

Figure 4A:
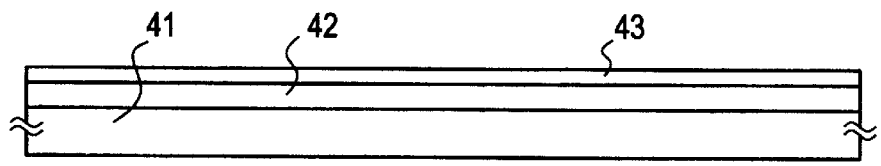
FIGS. 4A–4F are cross sectional views showing the manufacturing process in accordance with Example 3 of the present invention.

Next, an amorphous silicon film having a thickness of 500 Å was formed using a plasma CVD method. Subsequently, a solution of nickel acetate was spun dry in the same way as in Example 1 and a thin film of nickel acetate was formed on the amorphous silicon film, and then a thermal annealing treatment at 550° C. was carried out for 4 hours in a nitrogen atmosphere, crystallization occurred and the crystalline silicon film 43 was obtained. After this, the film may be subjected to a laser anneal in order to improve the crystallinity. (FIG. 4A)

Next, the crystalline silicon film 43 was patterned and the island-like silicon film 44 was formed. This island-like film 44 becomes the active layer of the TFT. Then, a silicon oxide film 45 having a thickness of 1200 Å was formed as a gate insulating film, covering this island-like silicon film. In this example the silicon oxide film was formed by means of an ECR-CVD method, using monosilane (SiH$_4$) as the raw material gas and dinitrogen monoxide as the oxidizing agent. Oxygen (O$_2$), nitrogen monoxide (NO), or nitrogen dioxide (NO$_2$), for example, could be used as the oxidizing agent instead of the dinitrogen monoxide. Moreover, the film forming conditions at this time were microwave (frequency 2.45 MHz) input 400 W with no substrate heating.

Moreover, a silicon oxide film could also be obtained by means of a reduced pressure CVD method using the same raw material gas and oxidizing agent. At this time the pressure should be 0.1–10 torr and the temperature should be 300°–500° C.

Figure 6:
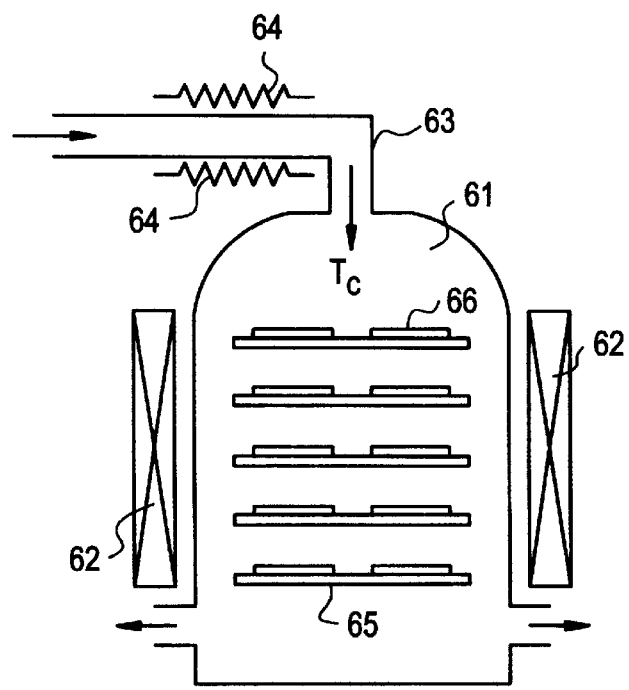
FIG. 6 is a schematic diagram showing an apparatus in accordance with the present invention.
Figure 7:
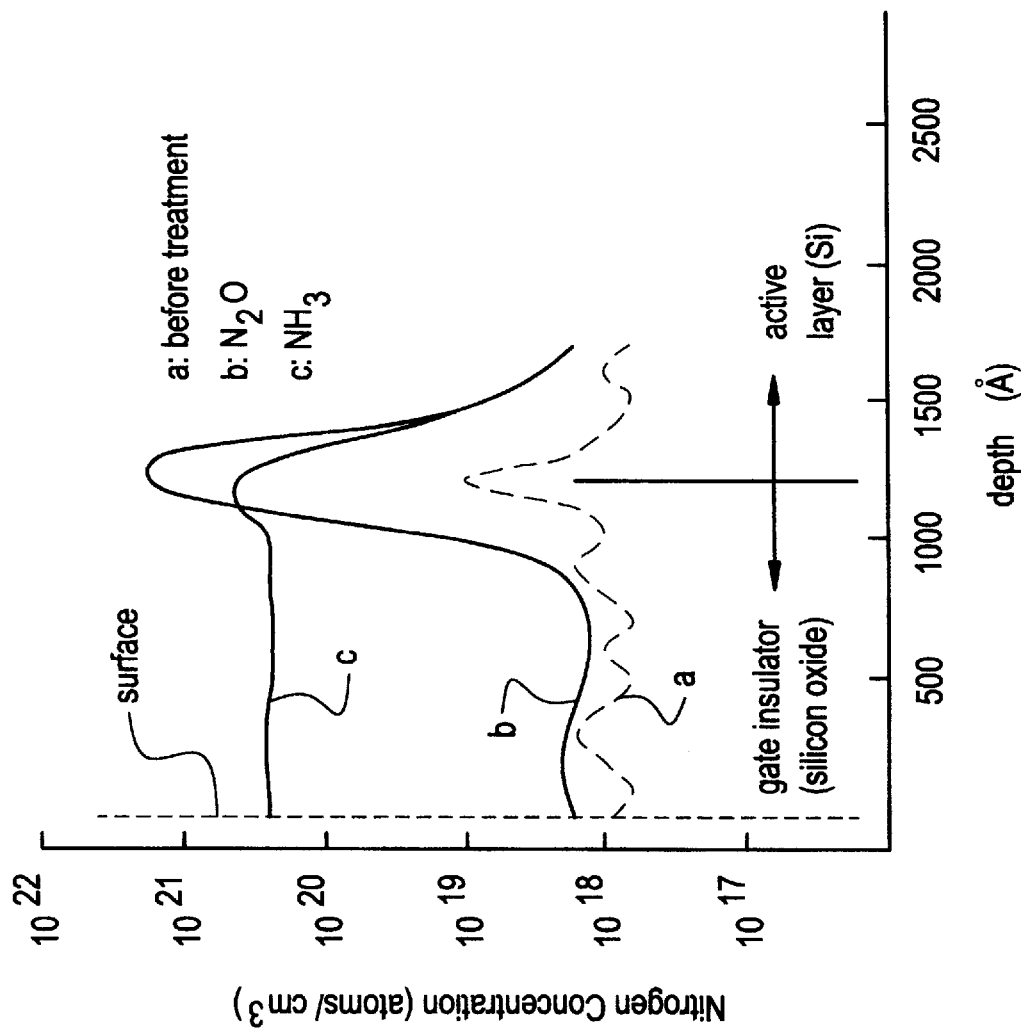
FIG. 7 is a result of a SIMS analysis of a gate insulating film.

After the gate insulating film was formed it was subjected to an annealing treatment of the present invention and its characteristics as a gate insulating film were improved. The apparatus shown in FIG. 6 was used in this example. In this apparatus there was no specially established part corresponding to the first reaction chamber in FIG. 1 and it had a construction in which the gas was rendered reactive by heating part of the reactive gas feed pipe 63 with the heater 64 and then introduced into the reaction chamber 61. A multiple receptor 65 was placed in the reaction chamber 61 and the substrates 66 were arranged on this respectively. The reaction chamber 61 was maintained at a constant temperature by means of the heater 62. In this example the internal diameter of the feed pipe 63 was set to 20–25 mm$\phi$. Furthermore, a distance from the site of the heater 64 to the reaction chamber of 10–150 cm was appropriate.

The gas feed pipe was heated to a temperature sufficiently high so that the gas in the pipe can be decomposed and this state can be maintained until the gas is introduced into the chamber 61.

Figure 4B:
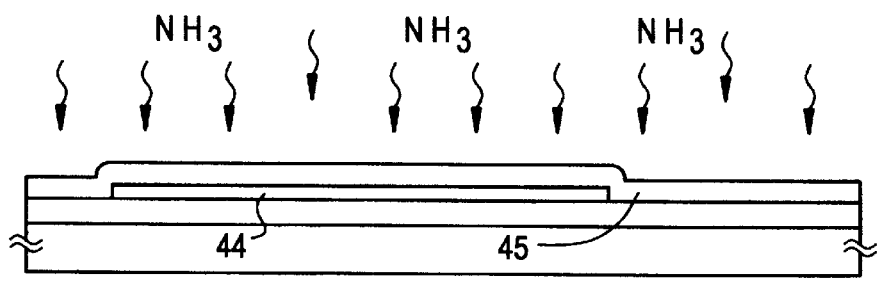

Ammonia was used as the thermal annealing atmosphere in this example. The ammonia was passed through the feed pipe 63 at a flow rate of 5 liters/minute. The heater 64 is set so that the temperature was 750°–1000° C. The temperature in the reaction chamber 61 is preferably 500°–650° C. In this example the heater 64 was set to 900° C. and the temperature in the reaction chamber 61 was set to 550° C. Thermal annealing was carried out for 1 hour under these conditions. It was possible in this way to nitride the silicon oxide film. Subsequently, the reaction gas may be changed to a dinitrogen monoxide atmosphere and a thermal anneal may be carried out under the same conditions as in Examples 1 and 2. (FIG. 4B)

Figure 4C:
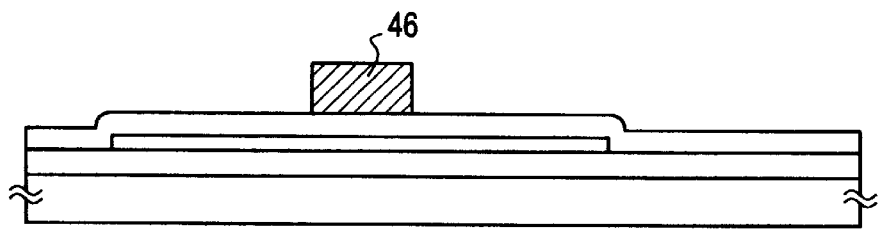

Subsequently, an aluminum film having a thickness of 6000 Å was formed by a sputtering method and this was then patterned and a gate electrode 46 was formed. A trace amount (0.1–0.5 percent by weight) of scandium was added to the aluminum film to prevent hillock formation. (FIG. 4C)

Figure 4D:
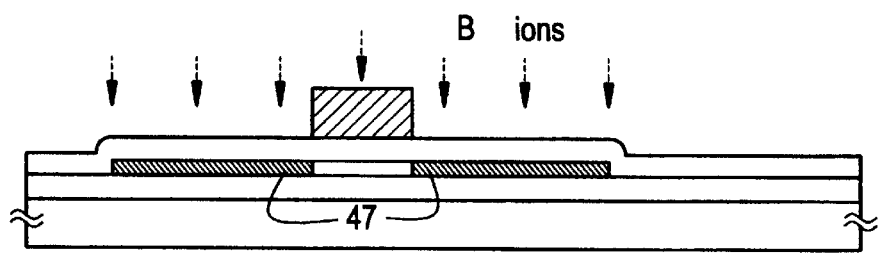
Figure 4E:
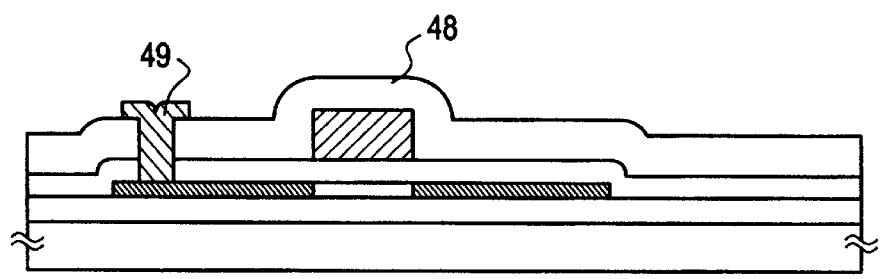

Subsequently, arsenic was implanted as an impurity in the island-like silicon film 44 with self-alignment using the gate electrode 46 as a mask, using the ion doping method. The dose rate at this time is $1 \times 10^{14}$–$8 \times 10^{15}$ atoms/cm$^2$ and the accelerating voltage is 40–80 kV and, for example, the dose rate was set to $1 \times 10^{15}$ atoms/cm$^2$ and the accelerating voltage was set to 65 kV. The P-type impurity regions (source and drain regions) 47 were formed as a result (FIG. 4D). Moreover, activation of the doped impurity regions 47 was carried out by irradiation with laser light. A KrF excimer laser (wavelength 248 nm, pulse width 20 nsec) was used for the laser light, and the energy density was 200–400 mJ/cm$^2$, being set, for example, to 250 mJ/cm$^2$.

Subsequently, a silicon oxide film having a thickness of 3000 Å was formed over the whole surface, using the plasma CVD method, as the inter-layer insulating film 48, and a contact hole was formed in the source region by etching this inter-layer insulating film 48 and the gate insulating film 45. Moreover, an aluminum film having a thickness of 5000 Å was formed using the sputter method and this was etched to form the source electrode 49. (FIG. 4 E)

Figure 4F:
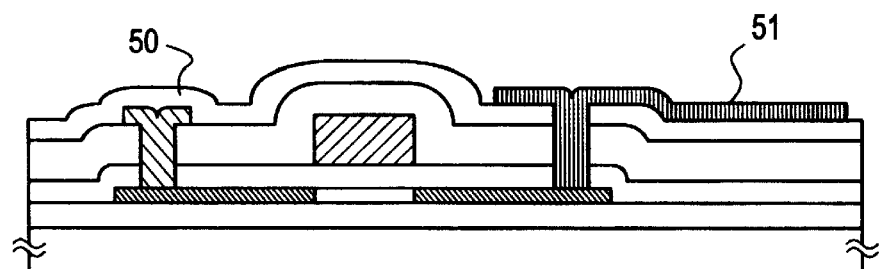
Figure 5:
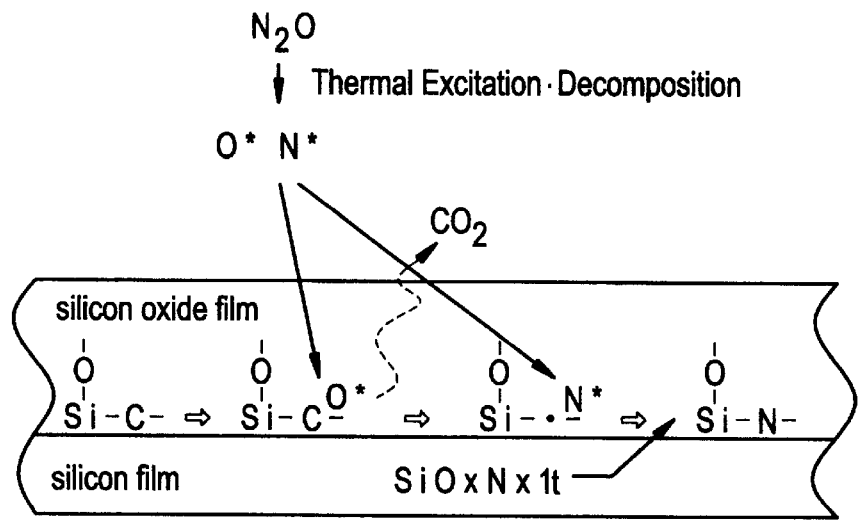
FIG. 5 is a diagram for showing the effect of the present invention.

Subsequently, a silicon nitride film having a thickness of 2000 Å was formed as the passivation film 50, using the plasma CVD method. The passivation film 50, the inter-layer insulating film 48 and the gate insulating film 45 were then etched to form the drain region contact hole. Moreover, an ITO film was formed using the sputter method and this was etched to form the picture element electrode 51. A picture element TFT was obtained using the process described above. (FIG. 4F)

As has been described above, the characteristics of TFT can be greatly improved by means of the present invention. Specifically, the recombination centers at the boundary between the gate insulating film and the active layer can be reduced and the S value and the electric field effect mobility are improved as a result. Furthermore, it is also possible to improve the withstand voltage of the gate insulating film itself and the TDDB (time dependence dielectric breakdown) can also be improved. As a result of improving the characteristics of the gate insulating film and the boundary in this way the number of defects which can trap electrons in the gate insulating film with respect to the implantation of hot electrons is reduced, and so deterioration caused by hot electrons (hot carrier degradation) is reduced and the reliability is improved.

In the present invention the highest process temperature for the element can be set to 700° C. or below, and preferably below 650° C., and this is of special industrial benefit.

In the examples the description has centered on TFTs on glass substrates, but an excellent effect can clearly be obtained where the invention is applied to multi-layer integrated circuits (known as solid integrated circuits or three-dimensional integrated circuits) for example. While the preferred embodiments of the invention are described, the present invention should not be limited to these particular examples. Many modifications may be made without departing the scope of the invention. For example, the nitrogen compound gas may optionally be excited by using an electrical energy or photo energy.

What is claimed is:

1. A method of manufacturing a semiconductor device comprising the steps of:

preparing a crystalline semiconductor film comprising silicon in the form of an island on an insulating surface;

forming a gate insulating film comprising silicon oxide through vapor phase deposition on and in direct contact with said semiconductor film and treating said gate insulating film with an atmosphere comprising a nitrogen compound gas at 400°–700° C., wherein said nitrogen compound gas is thermally decomposed or excited by making contact with a catalytic material for promoting thermal activation thereof.

2. The method of claim 1 wherein said vapor phase deposition is selected from the group consisting of a CVD method and a PVD method.

3. The method of claim 1 wherein said nitrogen compound gas is selected from the group consisting of nitrogen oxide and hydrogen nitride.

4. The method of claim 1 wherein at least a portion of said gate insulating film close to said semiconductor layer is nitrided.

5. The method of claim 1 wherein said crystalline semiconductor film contains a catalyst element which is capable of promoting crystallization of an amorphous silicon film, at a concentration in the range of $1 \times 10^{15}$ to $3 \times 10^{19}$ atoms/cm$^3$ as defined by a minimum concentration of a SIMS analysis with respect to said semiconductor film.

6. The method of claim 1 wherein said gate insulating film is formed by sputtering.

7. The method of claim 1 wherein said gate insulating film is formed by an ECR-CVD method.

8. The method of claim 1 wherein said gate insulating film is formed by CVD using a tetra-ethoxy-silane (TEOS) as a raw material.

9. The method of claim 1 wherein said gate insulating film is formed by low pressure CVD or plasma CVD using monosilane and oxygen containing gas as a raw material gas, said oxygen containing gas selected from the group consisting of oxygen and dinitrogen monoxide.

10. The method of claim 1 wherein said semiconductor film is formed on a glass substrate containing silicon, oxygen and boron of which distortion point is 550°–680° C.

11. The method of claim 1 wherein said semiconductor film includes a channel region and a crystal orientation in said semiconductor film is aligned in substantially one direction within said channel region.

12. The method of claim 3 wherein each concentration of water and carbon dioxide in said nitrogen compound gas is 1 ppm or lower, respectively.

13. The method of claim 1 further including etching said gate insulating film, wherein said gate insulating film has an etching rate of not more than 1000 Å/minute when etched at 23° C. with a buffered hydrofluoric acid containing a mixture of hydrogen fluoride, ammonium acetate and acetic acid at a ratio of 1:50:50.

14. The method of claim 1 wherein said gate insulating film contains nitrogen at 1–5 atoms % after said treating.

15. A method of manufacturing a semiconductor device comprising the steps of:

preparing a crystalline semiconductor film comprising silicon in the form of an island on a substrate;

forming a gate insulating film comprising silicon oxide through vapor phase deposition on and in direct contact with said semiconductor film;

preparing a first chamber and a second chamber connected to each other through a conduit;

placing said substrate having said crystalline semiconductor film and said gate insulating film formed thereon in said second chamber;

introducing a treatment gas into said first chamber, said treatment gas including at least a nitrogen compound gas;

heating said treatment gas in said first chamber in order to activate said treatment gas, said first chamber having a catalytic material for promoting activation of said treatment gas;

introducing said activated gas into said second chamber, and treating said gate insulating film with said activated treatment gas.

16. The method of claim 15 wherein said first chamber is maintained at a higher temperature than said second chamber.

17. The method of claim 16 wherein said substrate is a glass substrate having a strain point in a range of 550°–680° C.

18. A method of manufacturing a semiconductor device comprising the steps of:

preparing a crystalline semiconductor film comprising silicon in the form of an island on a substrate;

forming a gate insulating film comprising silicon oxide through CVD method on and in direct contact with said semiconductor film, said gate insulating film comprising silicon and oxygen; and treating said gate insulating film with a treatment gas comprising nitrogen at a temperature below a strain point of said substrate, wherein said treatment gas contacts a catalytic material to promote thermal exciting and decomposition thereof.

19. The method of claim 18 wherein said treatment gas is selected from the group consisting of nitrogen oxide and hydrogen nitride.

20. A method according to claim 18 wherein said gate insulating film is formed through plasma CVD using monosilane and dinitrogen monoxide.

21. A method according to claim 18 wherein said substrate is a glass substrate having a strain point in a range of 550°–680° C.

22. A method according to claim 18 wherein said treatment gas is selected from the group consisting of $N_2$, NO, $N_2O$, $NO_2$, $NH_3$, and $N_2H_6$.

23. A method according to claim 18 wherein said gate insulating film contains nitrogen at 1–5 atoms % after said treating.

24. A method according to claim 18 wherein said crystalline semiconductor layer is formed by the steps of:

forming an amorphous semiconductor film over said substrate;

holding a catalyst material on said amorphous semiconductor film, said catalyst material promoting crystallization of said amorphous semiconductor film; and annealing said substrate having said amorphous semiconductor film and said catalyst material in order to crystallize said amorphous semiconductor film.

25. A method according to claim 24 wherein said catalyst material is selected from the group consisting of nickel, iron, platinum, palladium and cobalt.

26. A method according to claim 24 wherein said crystalline semiconductor layer includes said catalyst material for promoting crystallization at a concentration in the range of $1 \times 10^{15}$ to $3 \times 10^{19}$ atoms/cm$^3$.

27. A method according claim 1 wherein said catalytic material for promoting thermal activation of said nitrogen compound gas is selected from the group consisting of platinum, palladium, nickel, titanium, vanadium and cobalt.

28. A method according to claim 15 wherein said catalytic material for promoting thermal activation of said nitrogen compound gas is selected from the group consisting of platinum, palladium, nickel, titanium, vanadium and cobalt.

29. A method according to claim 15 wherein said catalytic material is provided in a mesh-like form inside said first chamber.

30. A method according to claim 15 wherein said treatment gas is selected from the group consisting of $N_2$, NO, $N_2O$, $NO_2$, $NH_3$, and $N_2H_6$.

31. A method according to claim 15 wherein said gate insulating film contains nitrogen at 1–5 atoms % after said treating.

32. A method of manufacturing a semiconductor device comprising the steps of:

forming a gate insulating film comprising silicon oxide through vapor phase deposition over a substrate; and treating said gate insulating film with an atmosphere comprising a nitrogen compound gas at 400°–700° C., wherein said nitrogen compound gas is decomposed or excited by making contact with a catalytic material promoting thermal activation thereof.

33. A method according to claim 32 wherein said vapor phase deposition is selected from the group consisting of a CVD method and a PVD method.

34. A method according to claim 32 wherein said nitrogen compound gas is selected from the group consisting of nitrogen oxide and hydrogen nitride.

35. A method according to claim 32 wherein said gate insulating film is formed by sputtering.

36. A method according to claim 32 wherein said gate insulating film is formed by an ECR-CVD method.

37. A method according to claim 32 wherein said gate insulating film is formed by CVD using a tetra-ethoxy-silane (TEOS) as a raw material.

38. A method according to claim 32 wherein said gate insulating film is formed by low pressure CVD or plasma CVD using monosilane and oxygen containing gas as a raw material gas, said oxygen containing gas selected from, the group consisting of oxygen and dinitrogen monoxide.

39. A method according to claim 32 wherein each concentration of water and carbon dioxide in said nitrogen compound gas is 1 ppm or lower, respectively.

40. A method according to claim 32 wherein further including etching said gate insulating film, wherein said gate insulating film has an etching rate of not more than 1000 Å/minute when it is etched with a buffered hydrofluoric acid containing a mixture of hydrogen fluoride, ammonium acetate and acetic acid at a ratio of 1:50:50.

41. A method according to claim 32 wherein said gate insulating film contains nitrogen at 1–5 atoms % after said treating.

42. A method according to claim 32 wherein said catalytic material for promoting thermal activation of said nitrogen compound gas is selected from the group consisting of platinum, palladium, nickel, titanium, vanadium and cobalt.

43. A method of manufacturing a semiconductor device comprising the steps of:

forming a gate insulating film comprising silicon oxide through vapor phase deposition over a substrate;

placing said substrate having a crystalline semiconductor film and said gate insulating film formed thereon in a first chamber;

introducing a treatment gas into a second chamber connected with said first chamber, said treatment gas including at least a nitrogen compound gas;

heating said treatment gas in said second chamber in order to activate said treatment gas, said second chamber having a catalytic material for promoting activation of said treatment gas;

introducing said activated gas into said first chamber, and treating said gate insulating film with said activated treatment gas.

44. A method according to claim 43 wherein said second chamber is maintained at a higher temperature than said first chamber.

45. A method according to claim 43 wherein said substrate is a glass substrate having a strain point in a range of 550°–680° C.

46. A method according to claim 43 wherein said catalytic material for promoting thermal activation of said nitrogen compound gas is selected from the group consisting of platinum, palladium, nickel, titanium, vanadium and cobalt.

47. A method according to claim 43 wherein said catalytic material is provided in a mesh-like form inside said second chamber.

48. A method according to claim 43 wherein said treatment gas is selected from the group consisting of $N_2$, NO, $N_2O$, $NO_2$, $NH_3$, and $N_2H_6$.

49. A method according to claim 43 wherein said gate insulating film contains nitrogen at 1–5 atoms % after said treating.

50. A method of manufacturing a semiconductor device comprising the steps of:

preparing, over a substrate, a crystalline semiconductor film comprising silicon and a gate insulating film through vapor phase method in contact with said semiconductor film, said gate insulating film comprising silicon and oxygen; and treating said gate insulating film with a treatment gas comprising nitrogen, wherein said treatment gas contacts a catalytic material to promoted exciting and decomposition thereof.

51. A method according to claim 50 wherein said treatment gas is selected from the group consisting of nitrogen oxide and hydrogen nitride.

52. A method according to claim 50 wherein said step of treating said gate insulating film is conducted at a temperature below a strain point of said substrate.

53. A method according to claim 50 wherein said gate insulating film is formed through plasma CVD using monosilane and dinitrogen monoxide.

54. A method according to claim 50 wherein said substrate is a glass substrate having a strain point in a range of 550°–680° C.

55. A method according to claim 50 wherein said treatment gas is selected from the group consisting of $N_2$, NO, $N_2O$, $NO_2$, $NH_3$, and $N_2H_6$.

56. A method according to claim 50 wherein said gate insulating film contains nitrogen at 1–5 atoms after said treating.

* * * * *